US009285398B2

(12) United States Patent
Lu

(10) Patent No.: US 9,285,398 B2
(45) Date of Patent: Mar. 15, 2016

(54) SYSTEMS AND METHODS FOR SHIELDING CURRENT TRANSDUCERS

(71) Applicant: General Electric Company, Schenectady, NY (US)

(72) Inventor: Dan Tho Lu, Minden, NV (US)

(73) Assignee: General Electric Company, Schenectady, NY (US)

( * ) Notice: Subject to any disclaimer, the term of this patent is extended or adjusted under 35 U.S.C. 154(b) by 191 days.

(21) Appl. No.: 13/929,642

(22) Filed: Jun. 27, 2013

(65) Prior Publication Data

US 2015/0002139 A1   Jan. 1, 2015

(51) Int. Cl.
*G01R 19/00* (2006.01)
*G01R 35/00* (2006.01)

(52) U.S. Cl.
CPC .......... *G01R 19/0046* (2013.01); *G01R 35/005* (2013.01)

(58) Field of Classification Search
CPC .......................... G01R 19/0046; G01R 35/005
USPC ............................................. 324/156, 765.01
See application file for complete search history.

(56) References Cited

U.S. PATENT DOCUMENTS

| 5,828,282 | A  | * | 10/1998 | Tiemann ..................... 336/84 R |
|---|---|---|---|---|
| 8,217,644 | B2 |   | 7/2012  | Younsi et al. |
| 2005/0024035 | A1 | * | 2/2005 | Tabaian et al. ................ 323/315 |
| 2007/0103150 | A1 | * | 5/2007 | Tada et al. ..................... 324/229 |
| 2008/0121041 | A1 | * | 5/2008 | Smith et al. ..................... 73/618 |
| 2010/0315095 | A1 |   | 12/2010 | Younsi et al. |
| 2011/0006755 | A1 |   | 1/2011  | Younsi et al. |
| 2011/0148907 | A1 |   | 6/2011  | Lee |
| 2013/0076389 | A1 | * | 3/2013 | Wilson et al. ............ 324/765.01 |

OTHER PUBLICATIONS

U.S. Appl. No. 13/629,206, filed Sep. 27, 2012, Prabhakar Neti.

* cited by examiner

*Primary Examiner* — Jeff Natalini
*Assistant Examiner* — Brent J Andrews
(74) *Attorney, Agent, or Firm* — Fletcher Yoder, P.C.

(57) ABSTRACT

A shield for protecting a current transducer from noise may include a first annular ring that may be disposed adjacent to a first side of a current sensor. The shield may also include a second annular ring that may be disposed adjacent to a second side of the current sensor opposite the first side, such that the first and second annular rings each include magnetically permeable material.

17 Claims, 7 Drawing Sheets

SYSTEMS AND METHODS FOR SHIELDING CURRENT TRANSDUCERS

BACKGROUND

The subject matter disclosed herein relates to systems and method for calibrating current transducers. More specifically, the subject matter disclosed herein relates to calibrating phase and sensitivity characteristics of a current transducer output.

A current transducer generally includes a winding around a magnetic core. When the current transducer is placed around a cable or other type of conductor, a time-varying (e.g., alternating current) current conducting through the cable may produce a time-varying magnetic field in the magnetic core. The magnetic field may then induce a current in the winding of the current transducer. The current in the winding may be proportional to the current conducting through the cable. As such, the current in the winding may be used to measure a magnitude and direction of the current conducting in the cable.

However, conventional current transducers have relatively high tolerances in their electrical (i.e., resistance) and magnetic (i.e., inductance) characteristics due to magnetic properties of the materials inside the current transducers and the manufacturing process used to create the current transducers. That is, each current transducer may have its own sensitivity or tolerance levels based on its inherent characteristics. These sensitivity levels produce a higher degree of uncertainty in an electrical signal output by each current transducer. Additionally, these inherent characteristics may also introduce a phase shift between the signal output by the current transducer and a measured current. Accordingly, it would be beneficial to calibrate current transducers to perform at specified or known tolerance levels, and phase shifts.

Moreover, conventional current transducers use a steel tape to shield internal components, such as a current sensor, against various types of noise (e.g., electrical or magnetic noise). That is, the steel tape may be wound around a piece of metal to form a shield that may be placed around the current sensor. Using four steel tape-wound shields, each side of the current sensor may be shielded against magnetic disturbances and noise. However, creating each steel tape-wound shield is a complex process that may easily be mishandled, thereby jeopardizing the integrity of the overall shield around the current sensor. Accordingly, it would be beneficial to provide a more easily manufactured apparatus for shielding the components inside the current transducer.

BRIEF DESCRIPTION

Certain embodiments commensurate in scope with the original claims are summarized below. These embodiments are not intended to limit the scope of the claims, but rather these embodiments are intended only to provide a brief summary of possible forms of the presently disclosed systems and techniques. Indeed, the claims may encompass a variety of forms that may be similar to or different from the embodiments set forth below.

In one embodiment, a shield for protecting a current transducer from noise may include a first annular ring that may be disposed adjacent to a first side of a current sensor. The shield may also include a second annular ring that may be disposed adjacent to a second side of the current sensor opposite the first side, such that the first and second annular rings each include magnetically permeable material.

In another embodiment, a system may include a housing having a first cavity and a second cavity, a current sensor disposed in the first cavity, a calibration circuit disposed in the second cavity, and a set of shields disposed within the housing about the current sensor. The set of shields may include first and second shields disposed on axially opposite sides of the current sensor, and third and fourth shields disposed on radially opposite sides of the current sensor.

In yet another embodiment, a method of operation for a solid-side shield may include absorbing electrical and/or magnetic interference with a set of shields disposed about a current sensor, such that the set of shields may include first and second shields disposed on axially opposite sides of the current sensor. The first and second shields may be composed of magnetically permeable material.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
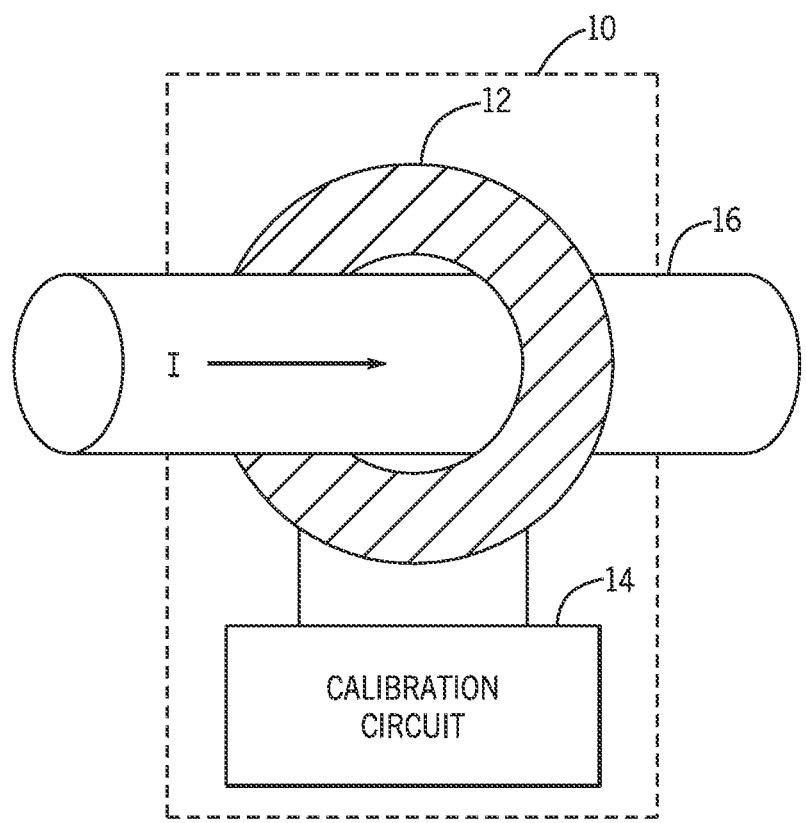
FIG. 1 is a schematic diagram illustrating an embodiment of a current transducer calibration system, in accordance with aspects of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements.

Current transducers may be used for a variety of purposes including measuring an actual current input and/or output of a device (e.g., generator, motor), determining an amount of leakage current within the device, or the like. One challenging application of a current transducer may include accurately measuring the leakage current of stator windings of a motor or generator in real-time. Leakage current is a complex signal that includes an amplitude and phase (i.e., relative to the motor's or generator's line voltage) having a real (i.e., resistive) component and an imaginary (i.e., capacitive) component. Moreover, the leakage current's signal level is generally very low as compared to the signal of the motor's line current. Therefore, an accurately calibrated current transducer would be beneficial for acquiring this measurement.

Keeping this in mind, embodiments of the present disclosure generally relate to a calibration circuit and methods for using the calibration circuit to calibrate different current transducers, such that each transducer may have similar sensitivity and phase characteristics in its measurements. In one embodiment, the calibration circuit may include two variable resistors connected in series. Here, the first variable resistor may be used to adjust the sensitivity of the measurement output of the current transducer, while the second variable resistor may be used to adjust the phase shift of the measurement output. By controlling the sensitivity and the phase shift of the measurement output of each current transducer, the calibration circuit may enable each current transducer to be calibrated to certain specifications, thereby creating uniformity between each manufactured current transducer and improving data quality for the measurements acquired by each calibrated current transducer.

In addition to providing systems and methods for calibrating current transducers, embodiments of the present disclosure also generally relate to a solid-side shield that may be coupled on the sides of a current sensor within the current transducer. The solid-side shield may protect the current sensor from various types of noise that may affect the measurement output of the current transducer. Keeping this in mind, in one embodiment, the solid-side shield may be fabricated to form four annular rings that may fit within a housing that may be used to shield each side of the current sensor. The annular rings may be composed of a magnetically permeable material and may be combined to fit precisely around each axial side of the current sensor. The annular rings may be fabricated to precise dimensions using a laser, a water jet, or the like. Since the annular rings may be fabricated to form a shielding barrier around each axial side of the current sensor, the solid-side shield may be capable of providing improved shielding as compared to using a traditional steel tape wound shield.

By way of introduction, FIG. 1 depicts a schematic diagram of a current transducer calibration system (current transducer 10). The current transducer 10 may include a current sensor 12 and a calibration circuit 14. The current sensor 12 may be a current transformer that employs a toroidal inductor and a ferrite core to sense a coupling magnetic field from an electric current conducting through a conductor. The calibration circuit 14 may be used to calibrate the measurement output of the current transducer 10.

In one embodiment, the current sensor 12 may be coupled around a conductor 16, which may conduct current I. Here, the toroidal inductor may produce a current or voltage output (i.e., measurement output of the current sensor 12) that is proportional to the amplitude of the current I. Although FIG. 1 depicts the current sensor 12 as being coupled around a single conductor 16, it should be noted that the current sensor 12 may be coupled around multiple conductors. As such, the current sensor 12 may measure the net current with respect to all of the conductors being monitored by the current sensor 12.

Generally, the measurement output of the current sensor 12 (i.e., the measurement output of the current transducer 10) may include a phase shift (e.g., degrees) between the measurement output and the current I. The amount of the phase shift may depend on the intrinsic inductance, capacitance, and/or resistance within the current transducer 10 (i.e., within the current sensor 12 and the calibration circuit 14) and an impedance of any load circuit coupled to the current transducer 10. Moreover, since each individual current transducer 10 may have different intrinsic inductance, capacitance, and/or resistance properties, each current transducer 10 may have different sensitivities or tolerances. That is, each current transducer 10 may output a slightly different measurement value for the same input current due to the different sensitivities of each current transducer 10. For example, one current transducer 10 may output 1 volt when 100 amps of current are conducting via the conductor 16 while another current transducer 10 may output 1.1 volts when the same 100 amps of current are conducting via the conductor 16. The sensitivity of each current transducer 10 may vary due to a variety of factors including a number of winding turns on the toroidal inductor, an intrinsic resistance of the toroidal inductor, the resistance of a load circuit, and the like.

Keeping the foregoing in mind, the calibration circuit 14 may control the phase shift and/or the sensitivity properties of the current transducer 10. That is, the calibration circuit 14 may adjust the phase shift and/or the sensitivity properties of the output of the current transducer 10 to match some desired phase shift and/or sensitivity property. In one embodiment, the calibration circuit 14 may be used to calibrate different current transducers 10, such that the measurement output for each current transducer 10 may be substantially similar or equal (e.g., less than 1%). For instance, the calibration circuit 14 may adjust the phase shift and sensitivity properties of the measurement output of multiple current transducers 10 such that each current transducer 10 outputs substantially similar or equal values for various input currents (e.g., current I).

Figure 2:
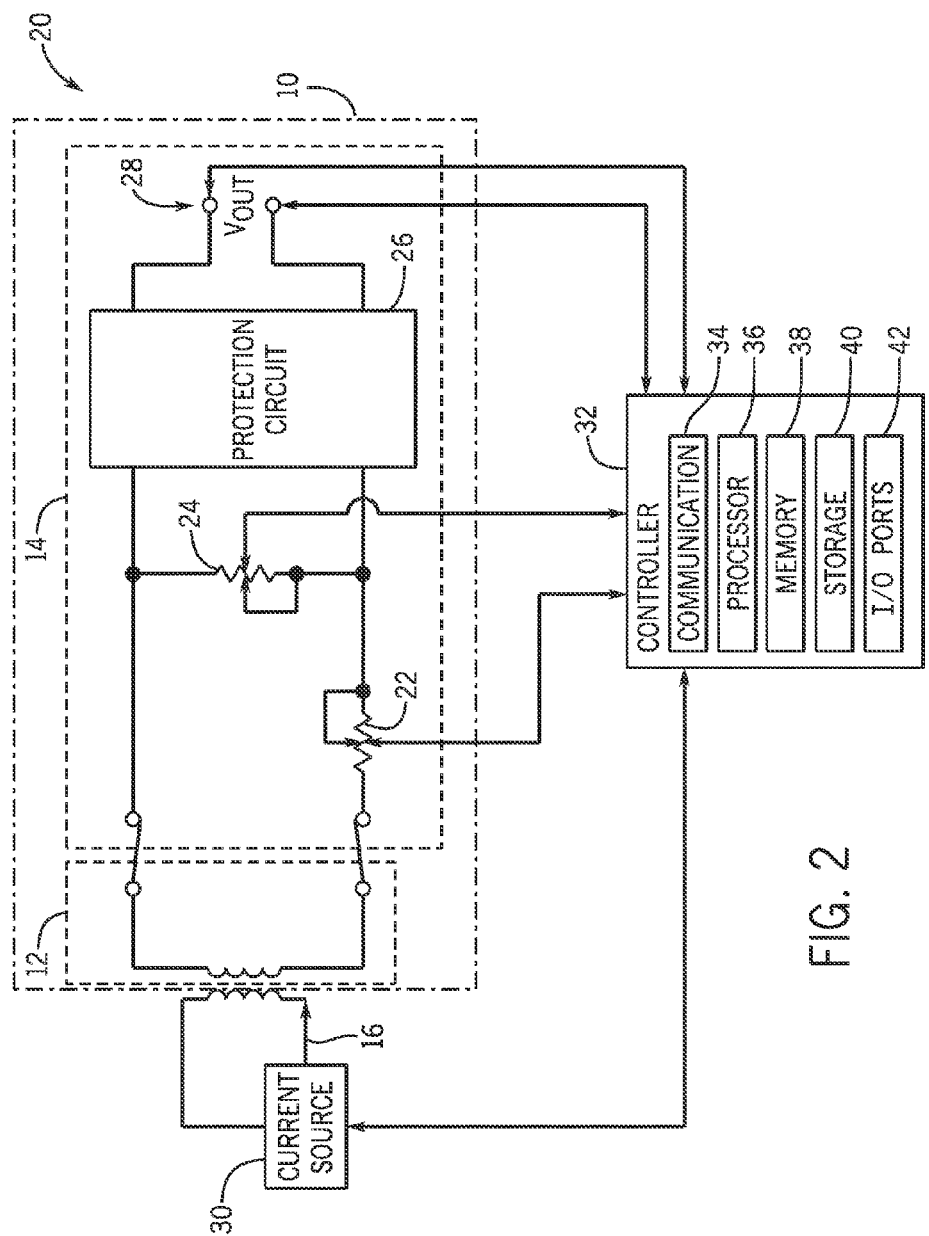
FIG. 2 illustrates an embodiment of a calibration circuit in the current transducer calibration system of FIG. 1, in accordance with aspects of the present disclosure.

The calibration circuit 14 may control the phase shift and/or the sensitivity properties of the current transducer 10 by adjusting the resistances of two variable resistors in the calibration circuit 14. For instance, FIG. 2 illustrates a circuit diagram 20 of the current transducer 10 that depicts the current sensor 12 coupled to the calibration circuit 14. As shown in FIG. 2, the calibration circuit 14 includes a phase shift resistor 22 connected in series with a sensitivity resistor 24, which may be used to control the phase shift and the sensitivity properties of the measurement output of the current transducer 10, respectively. The phase shift resistor 22 and the sensitivity resistor 24 may be variable resistors that may be adjusted to calibrate for the phase shift and the sensitivity properties of the measurement output of the current transducer 10. In certain embodiments, the phase shift resistor 22 and the sensitivity resistor 24 may be adjusted until the measurement output of the current transducer 10 substantially matches a desired or specified measurement output value. In this manner, multiple current transducers 10, each having a different current sensor 12 and a different calibration circuit 14, may be calibrated, such that each calibrated current transducer 10 may exhibit the same measurement properties even though each current transducer 10 may have different inherent inductances, capacitances, resistances, and the like. Moreover, if an operating current transducer 10 fails in the field, the calibration circuit 14 may be used to calibrate a replacement current transducer 10, such that the failed current transducer 10 may be replaced with a current transducer 10 that has the same phase shift and sensitivity properties of the current transducer 10 that is being replaced. As such, the replacement current transducer 10 may continue to provide a user or system with measurement data similar or equal to that of the previously employed current transducer 10, thereby maintaining the integrity of any subsequently collected measurement data.

In one embodiment, the calibration circuit 14 may be coupled across a secondary winding of the current sensor 12. The calibration circuit 14 may also be coupled to a protection circuit 26, which may include a number of resistors, diodes, zener diodes, and the like. The protection circuit 26 may protect the phase shift resistor 22, the sensitivity resistor 24, and the current transducer 10 from voltage spikes, short circuits, and the like. Moreover, the protection circuit 26 may protect additional equipment connected to the current transducer 10 or the calibration circuit 14 from excessive energy. Examples of the additional equipment may include signal-conditioning equipment, various typed of monitoring devices, plant control equipment, and the like.

The calibration circuit 14 may include an output terminal 28 that may measure a voltage across the sensitivity resistor 24. The output terminal 28 may correspond to the measurement output of the current transducer 10 and may also be used to calibrate the current transducer 10. That is, the voltage waveform acquired via the output terminal 28 may be used to determine whether the phase shift or the sensitivity properties of the current transducer 10 should be adjusted to target levels, as provided by a user, model, table, or the like. Further, in certain embodiments, the resistances of the phase shift resistor 22 and the sensitivity resistor 24 may each be adjusted until the voltage waveform acquired via the output terminal 28 substantially matches a desired voltage waveform that has specified phase shift and sensitivity properties.

As mentioned above, the measurement output of the current transducer 10 may be proportional to the current I conducting through the conductor 16. Keeping this in mind, the voltage waveform acquired at the output terminal 28 is also proportional to the current I. In one embodiment, the current I may be supplied to the conductor 16 by a current source 30. The current source 30 may be an accurate current source that may provide the current I, such that the current I may accurately reflect a current value as specified or input into the current source 30. In this manner, the current transducer 10 may be accurately calibrated based on a known current value provided to the conductor 16.

Generally, the phase shift resistor 22, the sensitivity resistor 24, and the current source 30 may be controlled and operated individually by a user/operator who may use the calibration circuit 14 to calibrate the current transducer 10. However, in certain embodiments, the phase shift resistor 22, the sensitivity resistor 24, and the current source 30 may be coupled to a controller 32. The controller 32 may control the phase shift resister 22, the sensitivity resistor 24, and the current source 30 using a communication component 34, a processor 36, a memory 38, a storage 40, input/output (I/O) ports 42, and the like.

The communication component 34 may be a wireless or wired communication component that may facilitate communication between various components (e.g., current source 30) within the current transducer 10. The processor 36 may be any type of computer processor or microprocessor capable of executing computer-executable code. The memory 38 and the storage 40 may be any suitable articles of manufacture that can serve as tangible machine-readable media to store processor-executable code or instructions. These articles of manufacture may represent computer-readable media (e.g., any suitable form of memory or storage) that may store the processor-executable code executable by the processor 36 to perform presently disclosed techniques.

The controller 32 may also be coupled to the output terminal 28, such that it may monitor the voltage waveforms output by the current transducer 10. In one embodiment, the controller 32 may receive phase shift and sensitivity properties from a user and may then automatically calibrate the current transducer 10. That is, the controller 32 may specify to the current source 30 a current value to provide to the conductor 16 and may subsequently monitor the voltage waveform at the output terminal 28. The controller 32 may then calibrate the current transducer 10 by adjusting the resistances of the phase shift resistor 22 and the sensitivity resistor 24 until the voltage waveform acquired at the output terminal 28 has phase shift and sensitivity properties that substantially matches the received phase shift and sensitivity properties. Additional details with regard to a method for calibrating the current transducer 10 using the calibration circuit 14 will be described in greater detail with respect to FIG. 3 below.

Figure 3:
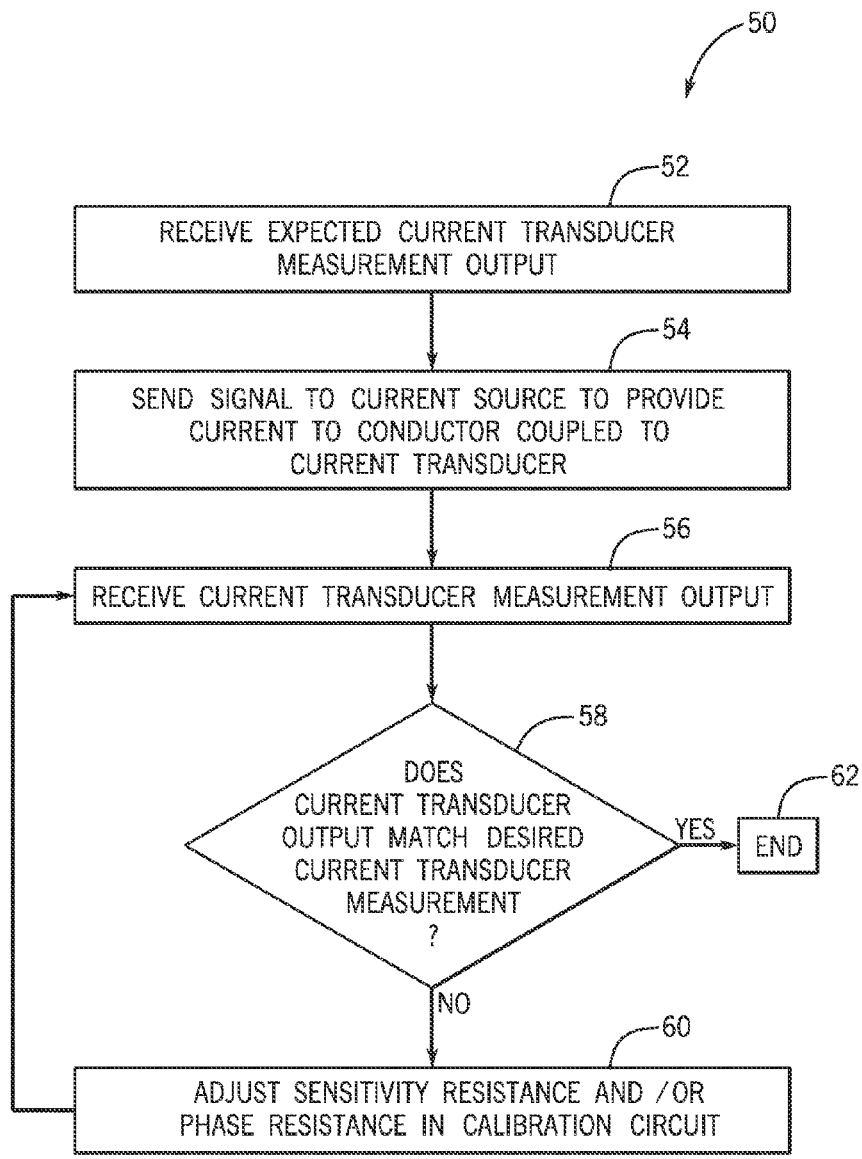
FIG. 3 is a flow chart illustrating an embodiment of a method for calibrating a current transducer using the current transducer calibration system of FIG. 1, in accordance with aspects of the present disclosure.

FIG. 3 illustrates a flow chart of a method 50 that may be employed for calibrating the current transducer 10 using the calibration circuit 14. In one example, the method 50 may be performed by the controller 32, however, it should be noted that the method 50 may also be performed by one or more users/operators who may control the resistances of the phase shift resistor 22 and the sensitivity resistor 24 as well as the current source 30 and who may monitor the voltage output at the output terminal 28.

At block 52, the controller 32 may receive an input current waveform and an expected or desired current transducer measurement output. The input current waveform may include an amplitude and frequency for a current waveform that represents current I, which may be supplied to the conductor 16 via the current source 30. In turn, the expected current transducer measurement output may correspond to an expected output value associated with the input current waveform for the current I conducting through the conductor 16 in the current transducer 10. Moreover, the current transducer measurement output may also specify a particular phase shift at which a waveform for the current transducer measurement output may shift from the waveform of the provided current I.

After receiving these values, at block 54, the controller 32 may send a signal to the current source 30 to provide the conductor 16 with the current I that corresponds to the input current waveform received at block 52. The current source 30 may then supply the conductor 16 with the appropriate current I.

At block 56, the controller 32 may receive the current transducer measurement output via the output terminal 28. In one embodiment, the controller 32 may receive a voltage waveform that may be proportional to a current waveform associated with the current I conducting through the conductor 16.

Using the expected current transducer measurement output received at block 52 and the actual current transducer measurement output received at block 56, the controller 32, at block 58, may determine whether the actual current transducer measurement output substantially matches the expected current transducer measurement output. For instance, the controller 32 may determine whether the amplitude of the actual voltage waveform matches the amplitude of the expected voltage waveform within the same degree or tolerance (e.g., less than 1%). Moreover, the controller 32 may also determine whether the actual voltage waveform is in phase with the expected voltage waveform. If either the amplitude of the actual voltage waveform does not match the amplitude of the expected voltage waveform or if the actual voltage waveform is not in phase with the expected voltage waveform, the controller 32 may proceed to block 60.

At block 60, the controller 32 may send a signal to the phase shift resistor 22, the sensitivity resistor 24, or both, to adjust their respective resistances such that the amplitude and the phase of the actual voltage waveform acquired at the output terminal 28 matches the amplitude and the phase of the expected voltage waveform. In one embodiment, the controller 32 may adjust the resistances of the phase shift resistor 22 and the sensitivity resistor 24 according to the transfer function of Equation 1, as shown below:

$$\frac{\overline{V_o}}{\overline{I_t}} = \frac{N_p}{N_s}\left[\frac{\omega^2 L_m^2 R_L}{(R_S + R_F + R_L)^2 + (\omega L_m)^2} + \frac{j\omega L_m R_L (R_S + R_F + R_L)}{(R_S + R_F + R_L)^2 + (\omega L_m)^2}\right] \quad (1)$$

where $\overline{V_o}$ corresponds to the actual voltage acquired at the output terminal 28, $\overline{I_t}$ corresponds to the current I conducting via the conductor 16, $N_p$ corresponds to the number of primary windings in the current transducer calibration system 10, $N_s$ corresponds to the number of secondary winding in the current transducer 12, $\omega$ corresponds to the angular frequency of the current I, $L_m$ corresponds to the inductance of the current transducer 12, $R_s$ corresponds to the resistance of the windings in the current transducer 12, $R_F$ corresponds to the resistance of the phase shift resistor 22, and $R_L$ corresponds to the sensitivity resistor 24.

Moreover, the phase angle may be characterized according to Equation 2, as shown below:

$$\theta(\text{phase angle}) = \text{Arctan}\left(\frac{R_S + R_F + R_L}{\omega L_m}\right) \quad (2)$$

As such, the controller 32 may adjust the resistances of the phase shift resistor 22 and the sensitivity resistor 24 based on the actual voltage acquired via the output terminal 28 and Equations 1 and 2. Afterwards, the controller 32 may then proceed back to block 56 and receive an updated current transducer measurement output and continuously perform blocks 56, 58, and 60 until the actual voltage waveform acquired via the output terminal 28 substantially matches the expected voltage waveform (e.g., less than 1% difference). As such, the controller 32 may adjust the resistances of the phase shift resistor 22 and the sensitivity resistor 24 until the actual voltage waveform substantially matches the expected voltage waveform.

Referring back to block 58, when the actual voltage waveform matches the expected voltage waveform, the controller 32 may proceed to block 62 and end the method 50. That is, since the actual voltage waveform matches the expected voltage waveform at block 62, the current transducer 10 may be considered calibrated as per the parameters received at block 52. In certain embodiments, the method 50 may be performed on a number of current transducers soon after being manufactured. As such, each of the manufactured current transducers may exhibit substantially similar phase shift and sensitivity properties. As a result, current transducers may be manufactured using lower cost components (e.g., interchangeable) since their effects to the capacitance, inductance, and the resistance of the current transducer may be compensated for using the calibration circuit 14.

Further, as mentioned above, one challenging aspect related to using the current transducer 10 may include accurately measuring a leakage current of stator windings of a motor or generator in real-time. Excessive leakage current in the stator windings may cause damage to the motor or generator. However, leakage current is a complex signal that includes an amplitude and phase (i.e., relative to motor's line voltage) and real (e.g., resistive) and imaginary (e.g., capacitive) components, and its signal level may be very low as compared to the signal of the motor's line current. Therefore, a current sensor with high accuracy and performance may be useful in consistently acquiring accurate leakage current measurements.

By employing the calibration circuit 14 described above, a number of similarly designed current transducers may consistently output similar or equal measurement values for the same input currents. That is, the calibration circuit 14 may calibrate different toroidal-type current transducers 10 that may have high tolerance levels in their electrical (e.g., resistance) and magnetic (e.g., inductance) properties due to the magnetic properties of the materials and manufacturing process used to create them. Moreover, the calibration circuit 14 may compensate for a phase shift between an output signal of the current transducer 10 and a measured leakage current. Therefore, the calibration circuit 14 described above may enable current transducers 10 to be manufactured with a much larger variation in component specifications. As a result, the manufacturing cost related to producing the current transducer may decrease and each current transducer 10 may be calibrated to meet more stringent performance specifications.

In addition to using the calibration circuit 14 to manufacture current transducers 10 having similar output measurement values, a solid-side shield may be used to consistently shield each manufactured current transducer 10. As mentioned above, traditional tape-wound shields may not be manufactured consistently due to the complexity of the manufacturing process. As such, each current transducer 10 shielded using a tape-wound shield may be affected by electrical and magnetic noise differently, thereby affecting the measurement output of each current transducer 10 differently.

Figure 4:
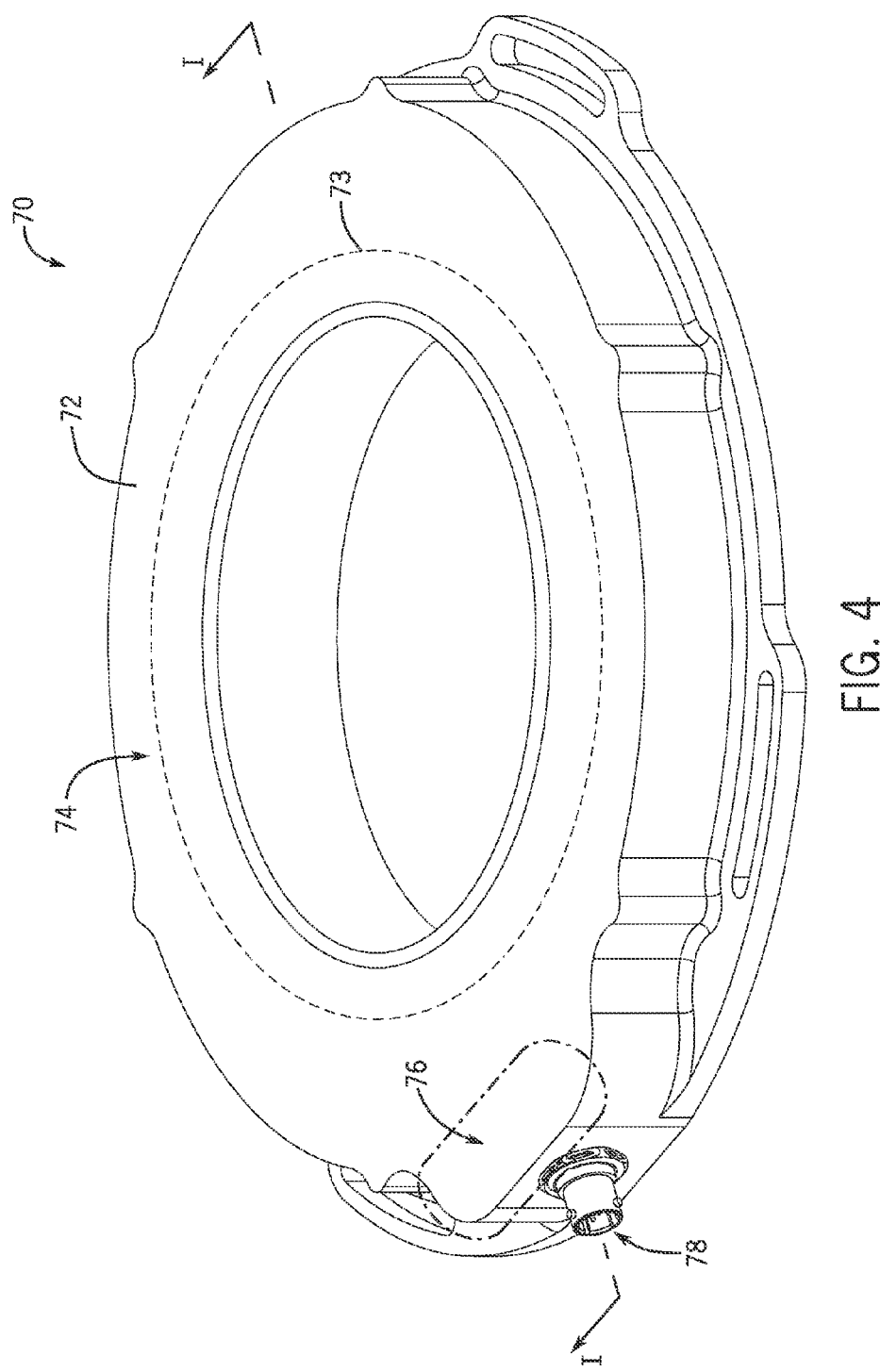
FIG. 4 illustrates a top perspective view of an embodiment of a housing for a shield to shield a current transducer in the current transducer calibration system of FIG. 1, in accordance with aspects of the present disclosure.

Keeping this in mind FIG. 4 illustrates a top perspective view of a solid-side shield assembly 70. The solid-side shield assembly 70, in one embodiment, may include a housing 72 that may generally form an annular shape 73 and may include an annular cavity 74 that may fit a magnetically permeable material used to shield the current transducer 10. The magnetically permeable material may absorb magnetic fields. In certain embodiments, the magnetically permeable material is such that its permeability may be measured with respect to free space.

The housing 72 may be composed of plastic, aluminum, any polymer, fiberglass, non-ferrite metals, or the like. In one embodiment, the housing 72 may include an extended cavity 76 that may enclose the calibration circuit 14. As such, the housing 72 may also include connector pins 78 that may be used to provide access to the output terminal 28 of the calibration circuit 14, which may enable a user to calibrate the current transducer 10 via the calibration circuit 14.

Figure 5:
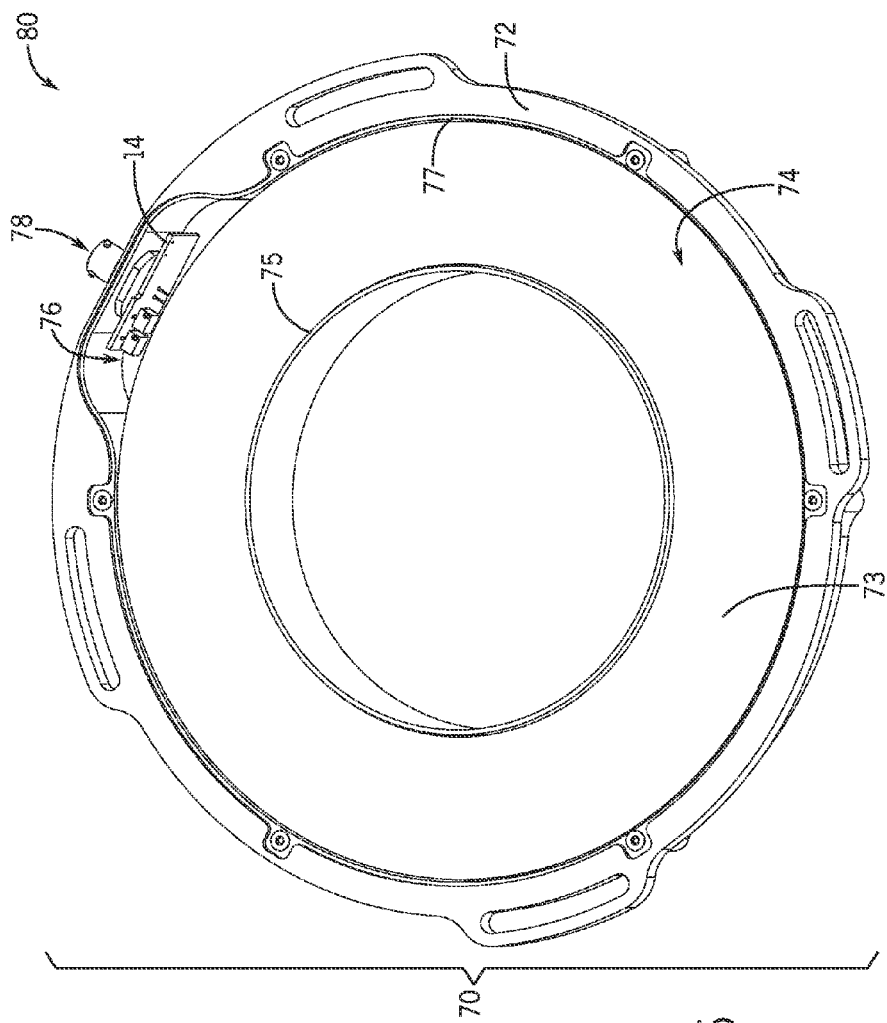
FIG. 5 illustrates an inside view of an embodiment of the housing of FIG. 4, in accordance with aspects of the present disclosure.

Keeping this in mind, FIG. 5 illustrates the annular cavity 74 and the extended cavity 76 from an inside view 80 of the housing 72. The housing 72 may include a base 73, an inner annular cavity wall 75 and an outer annular cavity wall 77. As such, the annular cavity 74 may encompass the space between the base 73, the inner annular cavity wall 75, and the outer annular cavity wall 77. Generally, the housing 72 may be formed, such that the base 73, the inner annular cavity wall 75, and the outer annular cavity wall 77 may be composed of the same material and formed from one piece of that material. In one embodiment, the calibration circuit 14 may fit inside the outer annular cavity wall 77 within the extended cavity 76, such that it may be accessed via connector pins 78, which may enable wires, cables, and the like access to the calibration circuit 14.

Figure 6:
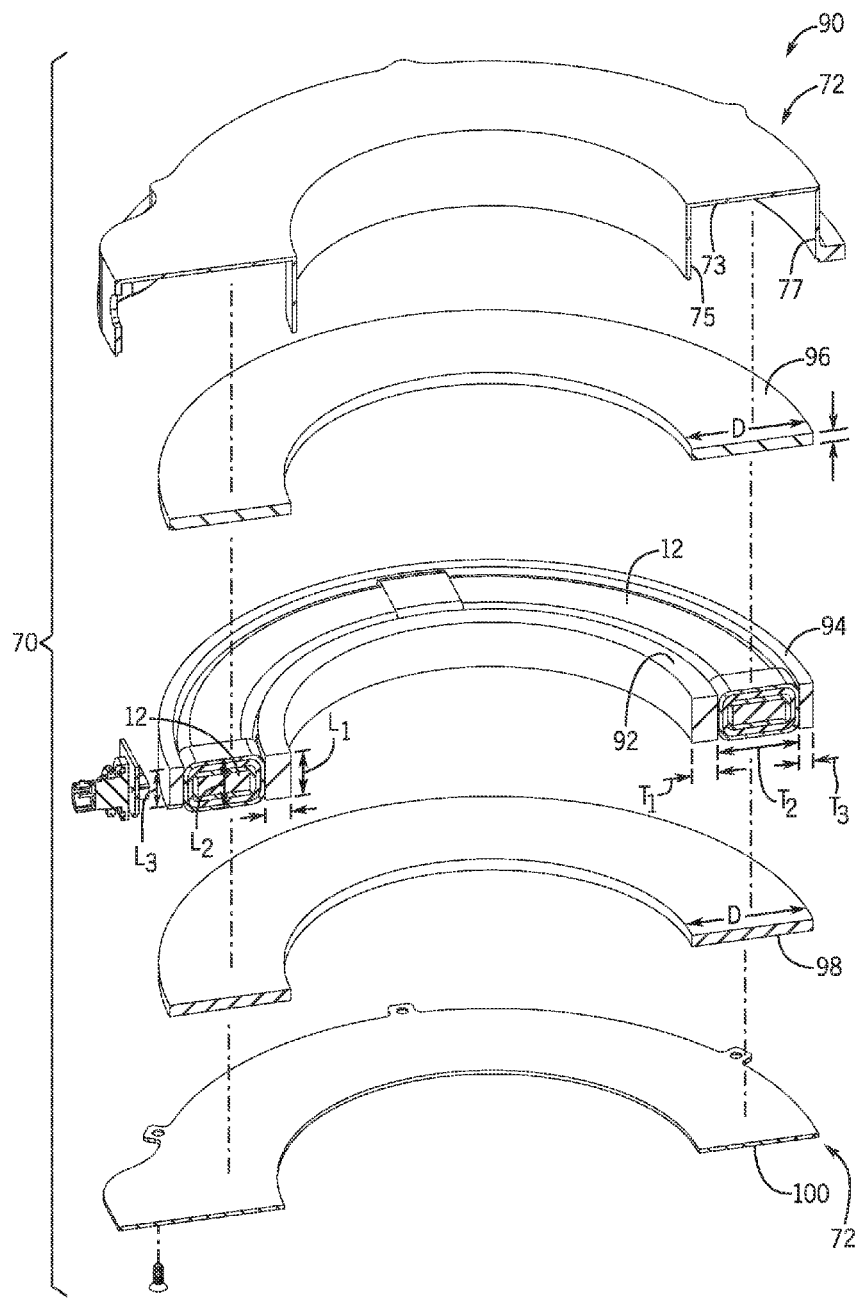
FIG. 6 illustrates an exploded view of an embodiment of the shield of FIG. 4, in accordance with aspects of the present disclosure.

As mentioned above, the annular cavity 74 may fit four annular rings, such that each annular ring may shield one side of the current sensor 12. FIG. 6 illustrates a cross-sectional exploded view 90 of the solid-side shield assembly 70 cut vertically down line I in FIG. 4. As such, FIG. 6 depicts how each annular ring may fit around the current sensor 12. As shown in FIG. 6, the solid-side shield assembly 70 may include an inner annular ring 92 (e.g., radially inner ring or disc), an outer annular ring 94 (e.g., radially outer ring or disc), a top side annular ring 96 (e.g., axially upper ring or disc), and a bottom side annular ring 98 (e.g., axially lower ring or disc). As such, the inner annular ring 92 and the outer annular ring 94 may be radially spaced apart from one another, and the top side annular ring 96 and the bottom side annular ring 98 may be axially spaced apart from one another. Additionally, the inner annular ring 92 and the outer annular ring 94 may be concentric with one another.

In one embodiment, a radial distance D between the inner and outer radii of the top side annular ring 96 and the bottom side annular ring 98 may be approximately equal to or greater than a radial thickness T1 of the inner annular ring 92 plus a radial thickness T2 of the current sensor 12 plus a radial thickness T3 of the outer annular ring 94. As such, the top side annular ring 96 and the bottom side annular ring 98 may effectively shield the top and bottom portions of the current sensor 12 from electrical or magnetic noise that may be present outside the housing 72.

Referring back to the inner annular ring 92 and the outer annular ring 94, a length L1 (e.g., axial height) of the inner annular ring 92 and a length L3 (e.g., axial height) of the outer annular ring 94 may be approximately equal to or greater than the length L2 (e.g., axial height) of the current sensor 12. As such, the inner and outer radii of the current sensor 12 may be effectively shielded from electrical or magnetic noise that may be present outside the housing 72. In combination, the inner annular ring 92, the outer annular ring 94, the top side annular ring 96, and the bottom side annular ring 98 may shield each side of the current sensor 12, such that the entire current sensor 12 is effectively shielded from various magnetic and electrical noise sources.

Although the solid-side shield assembly 70 has been described as having four annular rings, it should be noted that the solid-side shield assembly 70 may include just two annular rings. That is, in certain embodiments, the solid-side shield assembly 70 may include the top side annular ring 96 and the bottom side annular ring 98 to shield the sides of the current sensor 12 having the largest surface areas. In this case, the inner and outer annular rings may be tape-wound shields.

The housing 72 may also include a lid 100. The lid 100 may be coupled to the inner annular cavity wall 75, the outer annular cavity wall 77, the inner annular ring 92, the outer annular ring 94, the top annular ring 96, or the bottom annular ring 98 using fasteners such as screws and the like. Once the housing 72 is fastened together using the lid 100, the solid-side shield assembly 70 may effectively shield the current transducer 10 from electrical or magnetic noise that may be present outside the housing 72.

In certain embodiments, the inner annular ring 92, the outer annular ring 94, the top annular ring 96, and the bottom annular ring 98 may each be composed of a magnetically permeable material, such that its permeability may be measured with respect to free space, such as a Supermalloy (e.g., nickel-iron alloy), Metglas®, Ultraperm, MuMETAL®, or the like. As such, the inner annular ring 92, the outer annular ring 94, the top annular ring 96, and the bottom annular ring 98 may each be solid pieces of material fabricated to precise measurements using a laser cutter, a water jet cutter, or the like. Generally, the thickness of the inner annular ring 92, the outer annular ring 94, the top annular ring 96, and the bottom annular ring 98 may be at least 0.075 inches. In certain embodiments, the inner annular ring 92, the outer annular ring 94, the top side annular ring 96, or the bottom side annular ring 98 may include several pieces stacked on top of each other to form a complete inner annular ring 92, outer annular ring 94, top side annular ring 96, or bottom side annular ring 98. That is, for example, the top side annular ring 96 may be composed of 10 0.0075 inch pieces of the magnetically permeable material stacked on top of each other to form the single 0.075 inch top side annular ring 96.

In certain embodiments, two or three of the inner annular ring 92, the outer annular ring 94, the top annular ring 96, and the bottom annular ring 98 may be formed together as a single piece. That is, two or three of the inner annular ring 92, the outer annular ring 94, the top annular ring 96, and the bottom annular ring 98 may be fabricated from the magnetically permeable material, such that two or three of the two or three of the inner annular ring 92, the outer annular ring 94, the top annular ring 96, and the bottom annular ring 98 are formed together. For instance, the inner annular ring 92 and the bottom annular ring 98 may be fabricated from a single piece of the magnetically permeable material, thereby forming a first single shielding piece. In the same manner, the outer annular ring 94 and the top annular ring 96 may be fabricated from a single piece of the magnetically permeable material, thereby forming a second single shielding piece. Both of these pieces may then be positioned around the current sensor 12, such that the current sensor 12 may be shielded on each of its sides. In the same manner, the inner annular ring 92, the outer annular ring 94, and the top annular ring 96 may be fabricated from a single piece of the magnetically permeable material, thereby forming a single shielding piece that may fit around three sides of the current sensor 12. The bottom annular ring 98 may then be positioned on top of the resulting three-sided shielding piece to shield the current sensor 12 from noise in each direction.

Figure 7:
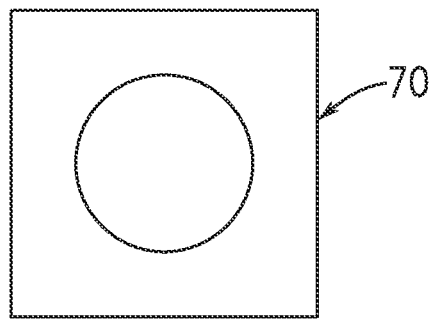
FIG. 7 illustrates a top view of a square-shaped embodiment of the shield of FIG. 4, in accordance with aspects of the present disclosure.

Although the solid-side shield assembly 70 has been described as having an annular-shaped housing 72, annular-shaped lid 100, and four annular shielding rings (i.e., inner annular ring 92, outer annular ring 94, top annular ring 96, and bottom annular ring 98), it should be noted that the solid-side shield assembly 70 may also be formed in other shapes, such that the current transducer 10 may fit within the solid-side shield assembly 70. By way of example, the solid-side shield assembly 70 may have a square-shaped outer edge and an annular-shaped inner edge, as depicted in FIG. 7. As such, the annular-shaped housing 72, annular-shaped lid 100, the outer annular ring 94, the top annular ring 96, and the bottom annular ring 98, as depicted in FIG. 6, may be formed such that each aforementioned piece may have a square-shaped outer edge and an annular shaped inner edge, while the inner annular ring 92 may have annular-shaped inner and outer edges.

Figure 8:
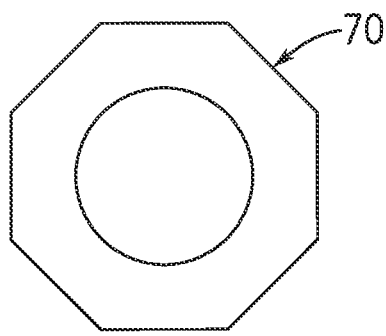
FIG. 8 illustrates a top view of a octagonal-shaped embodiment of the shield of FIG. 4, in accordance with aspects of the present disclosure.
Figure 9:
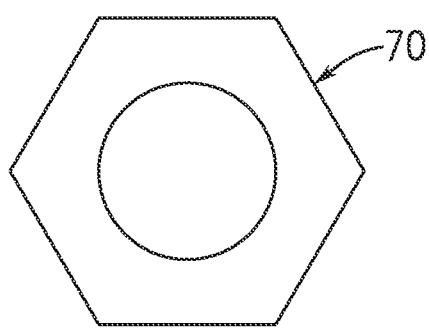
FIG. 9 illustrates a top view of a hexagonal-shaped embodiment of the shield of FIG. 4, in accordance with aspects of the present disclosure.

In another example, the solid-side shield assembly 70 may have an octagonal-shaped outer edge and an annular-shaped inner edge, as depicted in FIG. 8, or a hexagonal-shaped outer edge and an annular-shaped inner edge, as depicted in FIG. 9. In this manner, the annular-shaped housing 72, annular-shaped lid 100, the outer annular ring 94, the top annular ring 96, and the bottom annular ring 98, as depicted in FIG. 6, may have outer edges formed according to the shapes of the outer edges in FIG. 8 and FIG. 9, while the inner annular ring 92 may have annular-shaped inner and outer edges.

By precisely fabricating the inner annular ring 92, the outer annular ring 94, the top annular ring 96, and the bottom annular ring 98 to dimensions such that the current sensor 12 is completely enclosed by the shielding material, manufacturers and assemblers may consistently provide the same level of shielding to each manufactured current transducer 10. Moreover, the inner annular ring 92, the outer annular ring 94, the top annular ring 96, and the bottom annular ring 98 may be produced and ready for assembly with the current transducer 10, thereby making the manufacturing process for the current transducer 10 more efficient. That is, since the calibration circuit 14, the housing 72, the lid 100, the inner annular ring 92, the outer annular ring 94, the top annular ring 96, and the bottom annular ring 98 are each removable pieces, the assembly and repair of the current transducer 10 or the solid-side shield assembly 70 may be more efficiently performed.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A shield, comprising:
 a first annular ring configured to be disposed adjacent to a first side of a current sensor;
 a second annular ring configured to be disposed adjacent to a second side of the current sensor opposite the first side, wherein the first and second annular rings each comprise a magnetically permeable material;
 a third annular ring configured to be disposed adjacent to a third side of the current sensor; and
 a fourth annular ring configured to be disposed adjacent to a fourth side of the current sensor opposite the third side, wherein the first and second annular rings are axially spaced apart from one another, and the third and fourth annular rings are radially spaced apart from one another, and wherein a distance between an inner radius and an outer radius of the first annular ring and the second annular ring is approximately equal to or greater than a sum of a thickness of the third annular ring, a thickness of the current sensor, and a thickness of the fourth annular ring.

2. The shield of claim 1, wherein a distance between an inner radius and an outer radius of the second annular ring is approximately equal to or greater than a thickness of the third annular ring, a thickness of the current sensor, and a thickness of the fourth annular ring.

3. The shield of claim 1, wherein the third and fourth annular rings are concentric with one another.

4. The shield of claim 1, wherein the third and fourth annular rings are tape-wound shields.

5. The shield of claim 1, wherein the third and fourth annular rings each comprises the magnetically permeable material.

6. The shield of claim 1, wherein the magnetically permeable material comprises Supermalloy, Metglas, Ultraperm, MuMETAL, or any combination thereof.

7. A system, comprising:
 a housing having a first cavity and a second cavity;
 a current sensor disposed in the first cavity;
 a calibration circuit disposed in the second cavity, wherein the calibration circuit is configured to adjust phase and sensitivity properties of a measurement output by the current sensor; and
 a set of shields disposed within the first cavity of the housing about the current sensor, wherein the set of shields comprises first and second shields disposed on axially opposite sides of the current sensor, and third and fourth shields disposed on radially opposite sides of the current sensor, wherein each of the set of shields comprises magnetically permeable material, and wherein the housing is configured to enclose the set of shields.

8. The system of claim 7, wherein the first and second shields comprise first and second annular rings, respectively.

9. The system of claim 7, wherein the third and fourth shields comprise third and fourth annular rings, respectively.

10. The system of system of claim 7, wherein the first and second shields each overlap both the third and fourth shields.

11. The system of claim 7, wherein the set of shields is removably disposed within the housing.

12. The system of claim 7, wherein the housing comprises:
 a housing portion having an inner wall disposed circumferentially about a central opening, an outer wall disposed circumferentially about the inner wall, and a base extending between the inner and out walls; and
 a lid portion removably coupled to the housing portion by one or more fasteners.

13. The system of claim 7, wherein the first and third shields comprise a single piece.

14. The system of claim 7, wherein the first, third, and fourth shields comprise a single piece.

15. The system of claim 7, wherein the second cavity is disposed adjacent to the first cavity, and wherein the calibration circuit is configured to be placed adjacent to the set of shields when the set of shields is disposed within the first cavity.

16. A method, comprising:
 absorbing at least one of electrical and magnetic interference with a set of shields disposed about a current sensor, wherein the set of shields comprises:
  first and second shields disposed on axially opposite sides of the current sensor;
  third and fourth shields disposed on radially opposite sides of the current sensor, wherein each of the set of shields comprises magnetically permeable material; and
 calibrating the current sensor via a calibration circuit disposed within a housing configured to enclose the set of shields by adjusting phase and sensitivity properties of a current measurement output by the current sensor.

17. The method of claim 16, wherein calibrating the current sensor comprises:
 receiving an expected measurement output that corresponds to the current sensor, wherein the expected measurement output comprises expected phase and sensitivity properties;
 sending a signal to a current source to provide a current to a conductor monitored by the current sensor;

receiving the current measurement output from the current sensor, wherein the current measurement output comprises current phase and sensitivity properties; and adjusting the current phase and sensitivity properties to substantially match the expected phase and sensitivity properties.

* * * * *